US012262471B2

(12) United States Patent
Heyd et al.

(10) Patent No.: US 12,262,471 B2
(45) Date of Patent: Mar. 25, 2025

(54) DUAL-SIDED EXPANSION CARD WITH OFFSET SLOT ALIGNMENT

(71) Applicant: Liqid Inc., Broomfield, CO (US)

(72) Inventors: Andrew Rudolph Heyd, Longmont, CO (US); Brenden M. Rust, Loveland, CO (US); Christopher R. Long, Colorado Springs, CO (US); Sumit Puri, Calabasas, CA (US); Bryan Schramm, Broomfield, CO (US)

(73) Assignee: Liqid Inc., Westminster, CO (US)

( * ) Notice: Subject to any disclaimer, the term of this patent is extended or adjusted under 35 U.S.C. 154(b) by 276 days.

(21) Appl. No.: 17/935,190

(22) Filed: Sep. 26, 2022

(65) Prior Publication Data

US 2024/0107671 A1    Mar. 28, 2024

(51) Int. Cl.
*H05K 1/00* (2006.01)
*H05K 1/02* (2006.01)
*H05K 1/14* (2006.01)
*H05K 7/20* (2006.01)

(52) U.S. Cl.
CPC .......... *H05K 1/142* (2013.01); *H05K 1/0201* (2013.01); *H05K 7/2039* (2013.01); *H05K 2201/066* (2013.01); *H05K 2201/10159* (2013.01)

(58) Field of Classification Search
CPC .... H05K 1/142; H05K 1/0201; H05K 7/2039; H05K 2201/066; H05K 2201/10159
USPC .................................................... 361/679.32
See application file for complete search history.

(56) References Cited

U.S. PATENT DOCUMENTS

| 5,828,207 A | 10/1998 | Saadeh |
| 5,839,907 A | 11/1998 | Kuo |
| 6,061,750 A | 5/2000 | Beardsley et al. |
| 6,146,150 A | 11/2000 | Roberts |
| 6,325,636 B1 | 12/2001 | Hipp et al. |

(Continued)

FOREIGN PATENT DOCUMENTS

| CN | 206178569 U | 5/2017 |
| CN | 113050760 A | 6/2021 |
| TW | 201743217 A | 12/2017 |

OTHER PUBLICATIONS

International Search Report and Written Opinion for PCT Application No. PCT/US2023/033257, mailed Dec. 20, 2023; 17 pages.

(Continued)

*Primary Examiner* — Zhengfu J Feng

(57) ABSTRACT

A data storage card insertable into a peripheral slot of host system is provided that houses storage devices on both sides of the data storage card. A heat sink member establishes a skewed offset stackup among a primary circuit board and a secondary circuit board, and a circuit interconnect element couples across the skewed offset stackup between the circuit boards. The primary circuit board comprises an edge connector insertable into a peripheral slot connector and is configured to carry host signaling for the computer peripheral device. The secondary circuit board comprises a first set of data storage device connectors on a first side and a second set of data storage connectors on a second side. The skewed offset stackup allows for a thickness of storage devices inserted on both the first side and the second side to fit within a slot width of the peripheral slot.

16 Claims, 7 Drawing Sheets

(56) References Cited

U.S. PATENT DOCUMENTS

| | | |
|---|---|---|
| 6,647,451 B1 | 11/2003 | Barmore |
| 6,978,333 B2 | 12/2005 | Timmins et al. |
| 7,243,145 B1 | 7/2007 | Poortman |
| 7,260,487 B2 | 8/2007 | Brey et al. |
| 7,505,889 B2 | 3/2009 | Salmonsen et al. |
| 7,606,960 B2 | 10/2009 | Munguia |
| 7,725,757 B2 | 5/2010 | Padweka et al. |
| 7,877,542 B2 | 1/2011 | Chow et al. |
| 8,125,919 B1 | 2/2012 | Khanka et al. |
| 8,150,800 B2 | 4/2012 | Webman et al. |
| 8,656,117 B1 | 2/2014 | Wong et al. |
| 8,688,926 B2 | 4/2014 | Breakstone et al. |
| 8,706,932 B1 | 4/2014 | Kanapathippillai et al. |
| 8,880,771 B2 | 11/2014 | Subramaniyan et al. |
| 9,552,316 B2 | 1/2017 | Desimone et al. |
| 9,602,437 B1 | 3/2017 | Bernath |
| 9,996,495 B2 | 6/2018 | Feldman et al. |
| 10,660,228 B2 | 5/2020 | Schramm et al. |
| 10,929,327 B1* | 2/2021 | Schrempp ............ G06F 13/4068 |
| 10,993,345 B2 | 4/2021 | Schramm et al. |
| 2002/0034068 A1 | 3/2002 | Weber et al. |
| 2002/0059428 A1 | 5/2002 | Susai et al. |
| 2002/0080541 A1 | 6/2002 | Bunker et al. |
| 2003/0110423 A1 | 6/2003 | Helms et al. |
| 2003/0126478 A1 | 7/2003 | Burns et al. |
| 2005/0223136 A1 | 10/2005 | Tanaka et al. |
| 2006/0238991 A1 | 10/2006 | Drako |
| 2006/0242345 A1 | 10/2006 | Berl |
| 2006/0277206 A1 | 12/2006 | Bailey et al. |
| 2006/0291172 A1 | 12/2006 | Lee et al. |
| 2007/0067432 A1 | 3/2007 | Tarui et al. |
| 2008/0034153 A1 | 2/2008 | Lee et al. |
| 2008/0198744 A1 | 8/2008 | Menth |
| 2008/0281938 A1 | 11/2008 | Rai et al. |
| 2009/0006837 A1 | 1/2009 | Rothman et al. |
| 2009/0100280 A1 | 4/2009 | Lindsay |
| 2009/0190427 A1 | 7/2009 | Brittain et al. |
| 2009/0193201 A1 | 7/2009 | Brittain et al. |
| 2009/0193203 A1 | 7/2009 | Brittain et al. |
| 2009/0276551 A1 | 11/2009 | Brown et al. |
| 2010/0088467 A1 | 4/2010 | Lee et al. |
| 2011/0289510 A1 | 11/2011 | In et al. |
| 2011/0299317 A1 | 12/2011 | Shaeffer et al. |
| 2011/0320861 A1 | 12/2011 | Bayer et al. |
| 2012/0030544 A1 | 2/2012 | Fisher-Jeffes |
| 2012/0089854 A1 | 4/2012 | Breakstone et al. |
| 2012/0151118 A1 | 6/2012 | Flynn et al. |
| 2012/0166699 A1 | 6/2012 | Kumar et al. |
| 2012/0210163 A1 | 8/2012 | Cho |
| 2012/0317433 A1 | 12/2012 | Ellis et al. |
| 2013/0042041 A1 | 2/2013 | Sun |
| 2013/0132643 A1 | 5/2013 | Huang |
| 2013/0185416 A1 | 7/2013 | Larkin et al. |
| 2014/0047166 A1 | 2/2014 | Asnaashari et al. |
| 2014/0056319 A1 | 2/2014 | Hellwig |
| 2014/0059265 A1 | 2/2014 | Iyer et al. |
| 2014/0075235 A1 | 3/2014 | Chandhoke et al. |
| 2014/0103955 A1 | 4/2014 | Avritch et al. |
| 2014/0108846 A1 | 4/2014 | Berke et al. |
| 2014/0353264 A1 | 12/2014 | Venugopal et al. |
| 2014/0365714 A1 | 12/2014 | Sweere et al. |
| 2015/0074322 A1 | 3/2015 | Galles |
| 2015/0121115 A1 | 4/2015 | Chandra et al. |
| 2015/0186437 A1 | 7/2015 | Molaro |
| 2015/0212755 A1 | 7/2015 | Asnaashari |
| 2015/0304423 A1 | 10/2015 | Satoyama et al. |
| 2015/0370665 A1 | 12/2015 | Cannata et al. |
| 2015/0373115 A1 | 12/2015 | Breakstone et al. |
| 2016/0197996 A1 | 7/2016 | Barton et al. |
| 2016/0248631 A1 | 8/2016 | Duchesneau |
| 2016/0299863 A1 | 10/2016 | Feldman et al. |
| 2016/0335220 A1* | 11/2016 | Breakstone ............. G06F 1/185 |
| 2017/0011002 A1* | 1/2017 | Shin ...................... G06F 13/409 |
| 2017/0017600 A1 | 1/2017 | Breakstone et al. |
| 2017/0220505 A1* | 8/2017 | Breakstone ......... G06F 13/4282 |
| 2018/0113822 A1 | 4/2018 | Pronozuk et al. |
| 2020/0045843 A1* | 2/2020 | Schramm ................ G06F 1/185 |
| 2020/0412042 A1* | 12/2020 | Zhao ..................... H01R 12/722 |
| 2022/0172748 A1 | 6/2022 | Lu |

OTHER PUBLICATIONS

Aragon, Juan L. et al., "Control Speculation For Energy-Efficient Next-Generation Superscalar Processors," IEEE Transactions on Computers, vol. 55, No. 3, pp. 281-291, Mar. 2006.

International Application No. PCT/US2017/046602, International Search Report & Written Opinion, 8 pages, Oct. 19, 2017.

International Application No. PCT/US2017/046607, International Search Report & Written Opinion, 7 pages, Oct. 23, 2017.

International Application No. PCT/US2018/066177, International Search Report & Written Opinion, 14 pages, Mar. 6, 2019.

Lu, Yingping et al., "Performance Study of ISCSI-Based Storage Subsystems," IEEE Communications Magazine, pp. 76-82, Aug. 2003.

Taiwan Patent Application No. 107146879, Office Action, 29 pages, Oct. 3, 2019.

Taiwan Patent Application No. 107146879, Office Action, 7 pages, Apr. 7, 2020.

\* cited by examiner

DUAL-SIDED EXPANSION CARD WITH OFFSET SLOT ALIGNMENT

BACKGROUND

Computer systems typically include bulk storage systems, such as magnetic disk drives, optical storage devices, tape drives, or solid-state storage drives, among other storage systems. As storage needs have increased in these computer systems, networked storage systems have been introduced which store large amounts of data in a storage environment physically separate from end user computer devices. These networked storage systems typically provide access to bulk data storage over one or more network interfaces to end users or other external systems. In addition to storage of data, remote computing systems include various processing systems that can provide remote computing resources to end users. These networked storage systems and remote computing systems can be included in high-density installations, such as rack-mounted environments.

However, as the densities of networked storage systems and remote computing systems increase, various physical limitations can be reached. These limitations include density limitations based on the underlying storage technology, such as in the example of large arrays of rotating magnetic media storage systems. These limitations can also include computing density limitations based on the various physical space requirements for network interconnect as well as the large space requirements for environmental climate control systems.

In addition to physical space limitations, these bulk storage systems have been traditionally limited in the number of devices that can be included per host, which can be problematic in storage environments where higher capacity, redundancy, and reliability is desired. These shortcomings can be especially pronounced with the increasing data storage and retrieval needs in networked, cloud, and enterprise environments.

Overview

Various computer peripheral cards, devices, systems, and methods are provided herein. In one example, a data storage card insertable into a peripheral slot of host system is provided that houses storage devices on both sides of the data storage card. A heat sink member establishes a skewed offset stackup among a primary circuit board and a secondary circuit board, and a circuit interconnect element couples across the skewed offset stackup between the circuit boards. The primary circuit board comprises an edge connector insertable into a peripheral slot connector and is configured to carry host signaling for the computer peripheral device. The secondary circuit board comprises a first set of data storage device connectors on a first side and a second set of data storage connectors on a second side. The skewed offset stackup allows for a thickness of storage devices inserted on both the first side and the second side to fit within a slot width of the peripheral slot.

In another example, a data storage card includes an interface circuit board having an edge connector insertable into a slot connector of a host system and comprises a Peripheral Component Interconnect Express (PCIe) switch circuit configured to interwork host PCIe signaling with data storage devices carried by the data storage card. A carrier circuit board comprises data storage device connectors, with a first set of the data storage device connectors positioned on a first side and a second set of the data storage connectors positioned on a second side. A circuit interconnect element is configured to communicatively couple across a skewed offset stackup established between the interface circuit board and the carrier circuit board. A heat sink element maintains the skewed offset stackup and thermally couples to the PCIe switch circuit. Subassembly connection features are established on at least one among the heat sink element, the interface circuit board, and the carrier circuit board, and are configured to couple to storage subassemblies that carry the data storage devices.

In yet another example, an apparatus includes a circuit interconnect element configured to communicatively couple across a skewed offset stackup between the first circuit board and the second circuit board. The first circuit board comprises an edge connector insertable into a slot connector of a host system and configured to carry host signaling for data storage devices. The second circuit board comprises storage device connectors, with a first set of the data storage device connectors on a first side and a second set of the data storage connectors on a second side. A first storage subassembly comprises a first structural element holding first data storage devices connected into the first set of the data storage device connectors. A second storage subassembly comprises a second structural element holding second data storage devices connected into the second set of data storage device connectors. A heat sink member maintains the skewed offset stackup among a first circuit board and a second circuit board and couples to the first circuit board, the second circuit board, the first storage subassembly, and the second storage subassembly.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Figure 1:
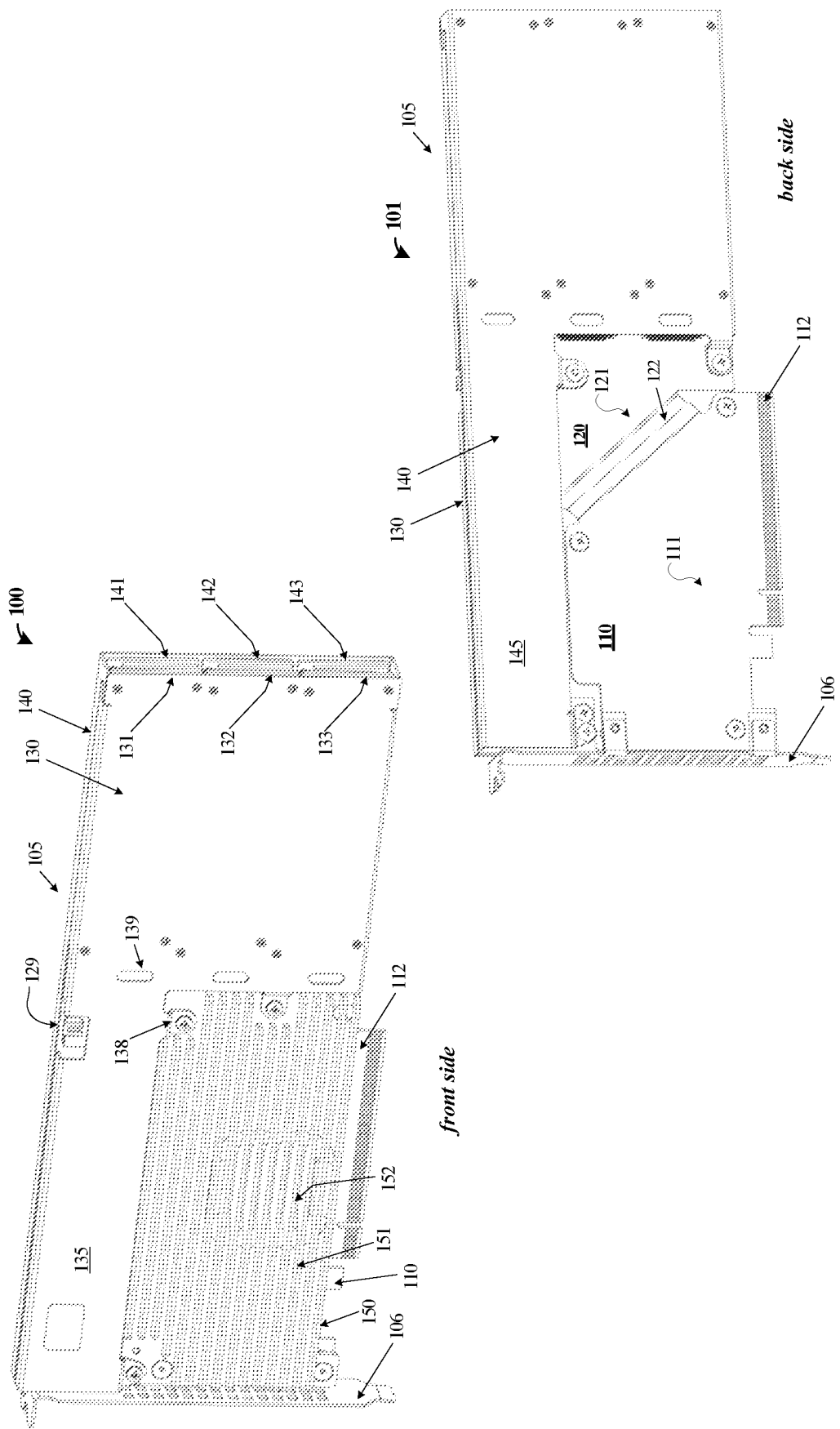
FIG. 1 illustrates an example configuration of a data storage card with attached subassemblies in an implementation.

In the examples herein, various computer peripheral expansion card arrangements are shown that can mount data storage drives to provide data storage capabilities for a host system. An expansion card can be insertable into a peripheral expansion slot or mating connector/socket of a host system. Typically, host systems can have one or more expansion slots available for plugging in of various add-in expansion cards which couple to the host system via one or more edge connectors. The expansion cards discussed herein can be insertable into a mating socket of the associated host system, such as a motherboard or daughterboard of a computer or server system. Various electronics, processing elements, storage elements, or other elements might be included in an expansion card to supplement the capabilities of the host system. In some cases, expansion cards might be added into a chassis or rack-mounted system external from the host system or systems.

In many expansion cards, also referred to as add-in or peripheral cards, a printed circuit board (PCB) forms a main structure and has various electrical components mounted thereto. The PCB forms an integral edge connector from a portion of the PCB and metallic traces. This edge connector couples into a mating slot on a motherboard or daughterboard within a chassis of a host system. Expansion slots are typically included in a host chassis, the quantity depending on the form factor of the chassis, and each expansion slot has a predetermined or fixed slot width defined by the specification of the electrical interface employed for the communication bus. For example, Peripheral Component Interconnect Express (PCIe) is a popular interface standard, and defines dimensional standards for expansion cards. Other bus standards are possible.

Typically, an expansion card must fit within a single expansion slot width. However, modern graphics processing unit (GPU) expansion cards might take up two or more slot widths using oversized expansion cards to accommodate fans, cooling apparatuses, heat sinks, interface connections, power electronics, and tall electrical components—although this arrangement precludes installing additional expansion cards in unused the expansion slot connectors now occupied by the oversized expansion card form factor. Expansion slots can also have an externally-accessible edge, which fits into a slot access aperture and covered by a slot cover, often on a back side of a chassis or computer case. The slot cover might include various interface ports to access features of the expansion card, such as network interface ports, graphics interface ports, peripheral device interface ports, maintenance ports, airflow vents, and the like. The slot cover also can be attached to the PCB of the expansion card, and be employed to keep out contaminants, direct airflow, and provide mounting support in a chassis.

However, positioning of the edge connector on most expansion cards with respect to the slot width and slot connector preclude placing tall electrical components on a 'back' side of the add-in card that have a stackup above a certain height. While passive surface mount components, such as resistors, capacitors, and inductors can often fit on the back side of the PCB, larger active components are often too tall to fit within a single slot width. Advantageously, the examples herein provide for enhanced PCB configurations which provide a PCB having a skewed offset from the slot connector to allow for modular data storage devices mounted on both sides of the PCB while still fitting within the expansion slot dimensions. An increase in storage density and component quantity can thus be achieved.

FIG. 1 illustrates an example configuration of a data storage card with attached subassemblies in an implementation. View 100 illustrates a front side view of expansion card 105 is shown, and view 101 illustrates a rear or back side view of expansion card 105. In views 100-101, expansion card 105 is seen as comprising several subassemblies or elements, namely storage subassembly 130, storage assembly 140, heat sink assembly 150, primary circuit board assembly 110, secondary circuit board assembly 120, and slot cover 106. Primary circuit board assembly 110 and secondary circuit board assembly 120 are communicatively coupled by circuit interconnect element 122 which couples primary printed circuit board 111 and secondary printed circuit board 121. While the terms primary and secondary are employed herein, it should be understood that other terms might be applicable, such as first and second, interface and carrier, or other terms.

Expansion card 105 comprises a compact two-sided arrangement which can fit into a single-width expansion slot, such as a PCIe expansion card slot. Expansion card 105 with subassemblies attached might comprise various form factors of expansion cards. However, in this example, expansion card 105 with subassemblies 130 and 140 comprises a full-length expansion card, such as a full-length PCIe expansion card compatible with the fifth generation (Gen 5) PCIe set of standards. The quantity of PCIe lanes handled by edge connector 112 can vary, but in this example comprises sixteen (×16) lanes. Other example form factors include HHHL (half-height half-length), FHHL (full-height half-length), FHFL (full-height full-length), HHFL (half-height full length), among others. Data storages drives/modules (SSDs) or other devices, such as dynamic random-access ram (DRAM) modules, are arranged on both sides of expansion card 105.

As will be discussed in further examples below, solid state drive (SSD) storage module connectors 131-134 and 141-144 are arrayed onto secondary or carrier circuit board assembly 120 to hold up to eight (8) storage drive modules each with an associated storage capacity. In one example configuration, eight (8) 8 terabyte (TB) storage modules are employed, with a combined data storage capacity of 64 TB. These storage module connectors can comprise E1.S compatible connectors defined by the Enterprise & Datacenter Storage Form Factor (EDSFF) standards that may use the SFF-TA-1002 ×4 or ×8 connectors, among others, including E1.L, E3.S, and E3.L compatible connectors. Other examples may use other storage drive connector types, such as M.2 connector types. However, regardless of the connector type, a portion (131-133 and 141-143) of the storage drive connectors are arrayed on a rear end of expansion card 105 such that any data storage drives attached into such connectors are cantilevered from the connectors and into free space from secondary circuit board assembly 120. A further portion (134 and 144) of the storage drive connectors are facing the opposite direction as connectors 131-133 and 141-143 to hold corresponding storage drive modules on secondary circuit board assembly 120.

Storage subassembly 130 and storage assembly 140 each include structural supports for an end of each data storage drive, and storage subassembly 130 and storage assembly 140 are coupled to heat sink assembly 150 or other portions of circuit assemblies 110 or 120. Thus, the storage drives that cantilever from secondary circuit board assembly 120 attach first to an associated storage subassembly before being inserted into the corresponding connectors of secondary circuit board assembly 120. Structural chassis members 135 and 145 can comprise sheet metal formed into the shaped shown herein, or may be machined from associated workpieces, additively manufactured (e.g., 3D printed), cast, molded, or otherwise formed to mount to storage drives and to the corresponding circuit board assembly or heat sink element via fasteners. One example thickness of structural chassis members 135 and 145 is 32 thousandths of an inch (mils). While a metal or conductive material, such as aluminum or steel, can form structural members 135 and 145 to provide for heat spreading and heat dissipation for attached storage drives, other materials might be considered, such as polymers, composites, organic materials, and the like. Various heat conduction materials can be applied between structural members 135 or 145 and associated storage drives to better conduct thermal energy from such storage drives. Various surface treatments, such as anodization, paint, wraps, or protective oxidation can be applied. Inspection holes, such as hole 139, can be included in chassis members 135 and 145 to provide for inspection of connections/connectors of associated storage drives. Mounting tabs, such as tab 138, are included to attach or otherwise couple chassis members 135 and 145 to heat sink assembly 150 or circuit boards 111/121.

Heat sink assembly 150 comprises heat sink element 151 having radiator fins. Heat sink element 151 is thermally coupled to one or more circuit elements attached to primary circuit board 110. In one example, heat sink assembly 150 couples to a communication switch circuit or control processor on primary circuit board 110 via thermal contact 152. Moreover, heat sink assembly 150 acts as a structural backbone or structural support for the remainder of the elements and subassemblies of expansion card 105, and includes various contact points to establish such structural features. Thus, primary circuit board assembly 110 and secondary circuit board assembly 120 both couple to heat sink assembly 150, and heat sink assembly 150 maintains the skewed offset relationship between circuit boards of primary circuit board assembly 110 and secondary circuit board assembly 120. Also, heat sink assembly 150 can couple to the storage subassemblies (130 and 140) and to at least a portion of slot cover 106. Various fasteners, such as screws, standoffs, self-clinching fasteners, circuit board threaded inserts, and other elements can couple the aforementioned elements to heat sink assembly 150. Heat sink assembly 150 can include geometries and material stackups to provide for the skewed offset relationship between the circuit boards, such as threaded holes, spacer, or screw supports which provided the desired offset amount. Heat sink assembly can comprise various heat conducting materials, such as aluminum, copper, or various other materials and alloys. Typically, heat sink assembly 150 is formed from machining, casting/molding, or additive manufacturing.

Primary circuit board assembly 110 and secondary circuit board assembly 120 each comprise one or more associated printed circuit boards (PCB), such as printed circuit board 111 and printed circuit board 121. Additionally, various circuitry and electrical components can be mounted to these circuit boards via a soldering process, such as connectors 131-134 and 141-144. As will be seen herein, primary circuit board 121 can include a communication switch circuit, such as a PCIe switch integrated circuit device. Edge connector 112 also is formed from the circuit board material of circuit board 111, and includes various conductive pads and traces to route signals and power connections from edge connector 112 to other components of circuit board 111. Circuit board 111 and 121 are coupled over one or more connection pathways, such as illustrated by circuit interconnect element 122. Circuit board 121 also includes various storage device connectors, as will be discussed below, and traces, vias, and pads for routing corresponding signals and power. Circuit board 121 can also include auxiliary or sideband signaling connectors for debug or maintenance, as well as external power connectors for providing additional power to storage devices or other components. Element 129 is included as representative of such an external power connection or auxiliary signaling.

Circuit interconnect element 122 carries signaling and power to and between primary circuit board 111 and secondary circuit board 121. Circuit interconnect element 122 might carry PCIe/NVMe signaling, sideband signaling, power connections, among other electrical signaling between primary circuit board 111 and secondary circuit board 121. Circuit interconnect element 122 can support connections that span across different planes or orientation between circuit boards 111 and 121 to provide the skewed offset relationship. Circuit interconnect element 122 might comprise one or more sections of flexible circuitry or printed circuit flex elements, among various rigid portions. Rigid-flex circuit elements can be employed with both flexible and rigid portions.

Figure 2:
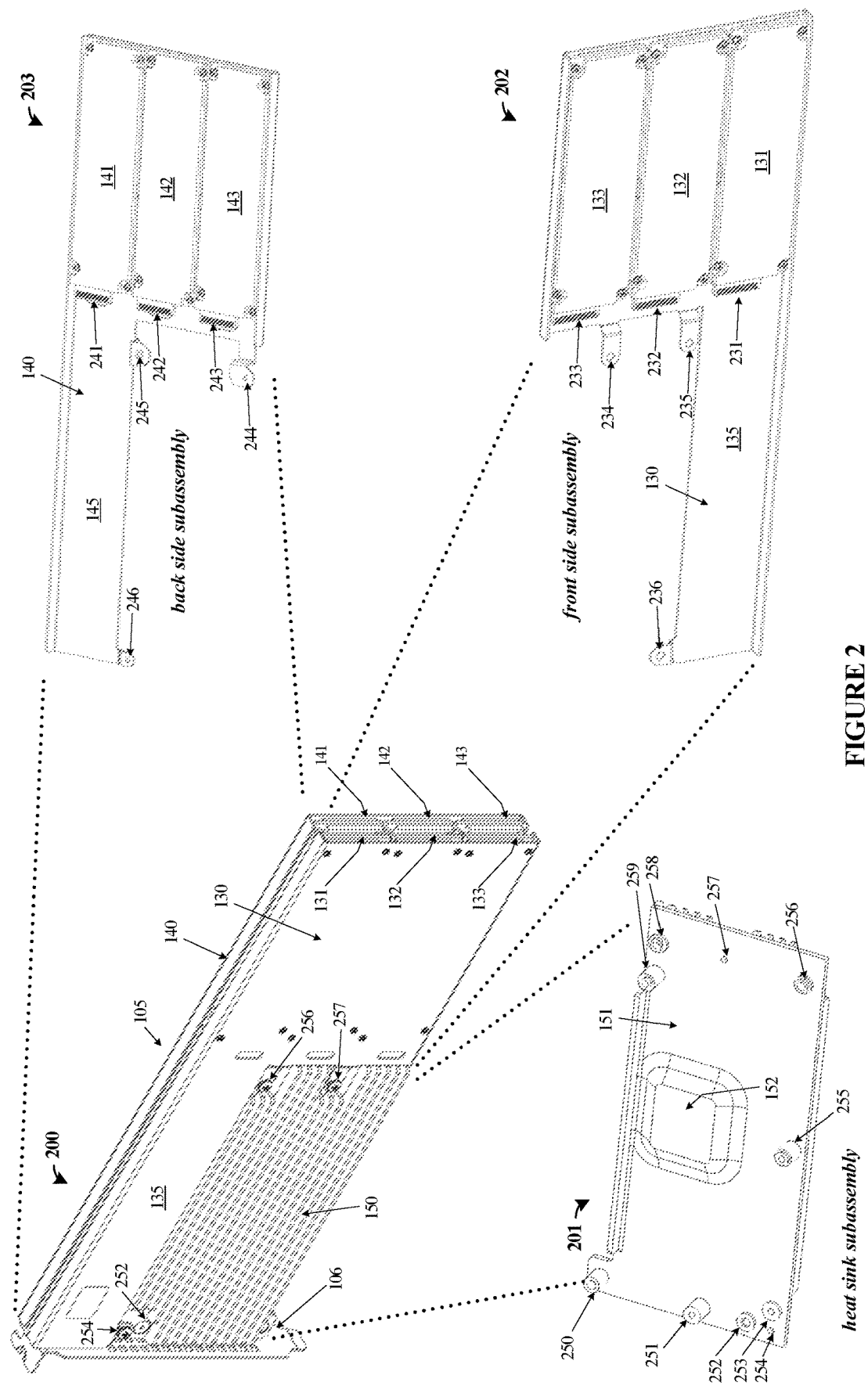
FIG. 2 illustrates an example configuration of a data storage card with corresponding subassemblies in an implementation.

FIG. 2 illustrates an example configuration of a data storage card with corresponding subassemblies in an implementation. View 200 includes a view of assembled expansion card 105 having heat sink assembly 150 and storage subassemblies 130 and 140 attached. View 201 illustrates a heat sink subassembly 150 in a flipped orientation to provide visibility to structural support features 250-259. View 202 illustrates a "front side" storage subassembly 130 having three storage drives 131-133 attached. View 202 shows storage subassembly 130 flipped in orientation to provide visibility to attached storage drives. View 203 illustrates a "back side" storage subassembly 140 having three storage drives 141-143 attached.

Heat sink subassembly 150 includes heat sink element 151 having corresponding fins and thermal contact feature 152. Thermal contact feature 151 comprises a depression, riser, or platform in the material forming heat sink element 150 to thermally contact a corresponding integrated circuit device. Thermal paste or pads might be included between thermal contact feature 152 and the target devices, and more than one contact might be included to thermally contact more than one integrated circuit device.

Heat sink subassembly 150 also includes several structural features 250-259 to couple to other subassemblies and circuit boards, and to maintain such circuit boards in a designated alignment, skew, or offset. These structural features 250-259 include holes, threaded inserts, pressed inserts, apertures, standoffs, and/or spacers. Features 250, 251, 255, and 259 comprise spacers or standoffs which couple to circuit board 111, and have a first height. Features 252, 256, and 258 comprise spacers or standoffs which couple to circuit board 121, and have a second height which is a different (shorter) height than those of features 250, 251, 255, and 259. Thus, features 250, 251, 252, 255, 256, 258, and 259, when coupled to respective circuit boards 111 and 121, establishes a skewed offset relationship among circuit boards 111 and 121. Some of features 250-259 also couple to storage assemblies 130 and 140 to mount these storage subassemblies to heat sink assembly 150. In this manner, heat sink assembly 150 acts as a structural backbone for expansion card 105. Slot cover 106 can couple to features 250 and 252, thus spanning both circuit boards. Storage subassemblies 230 and 240 couple to heat sink assembly 150 via support features 234-236 and 244-246 which mount to features 254, 256, and 257. Furthermore, storage subassemblies 230 and 240 receive additional structural support from edge connectors 231-233 and 241-243 of the attached storage drives which mate into receiving sockets of secondary circuit board assembly 120.

Figure 3:
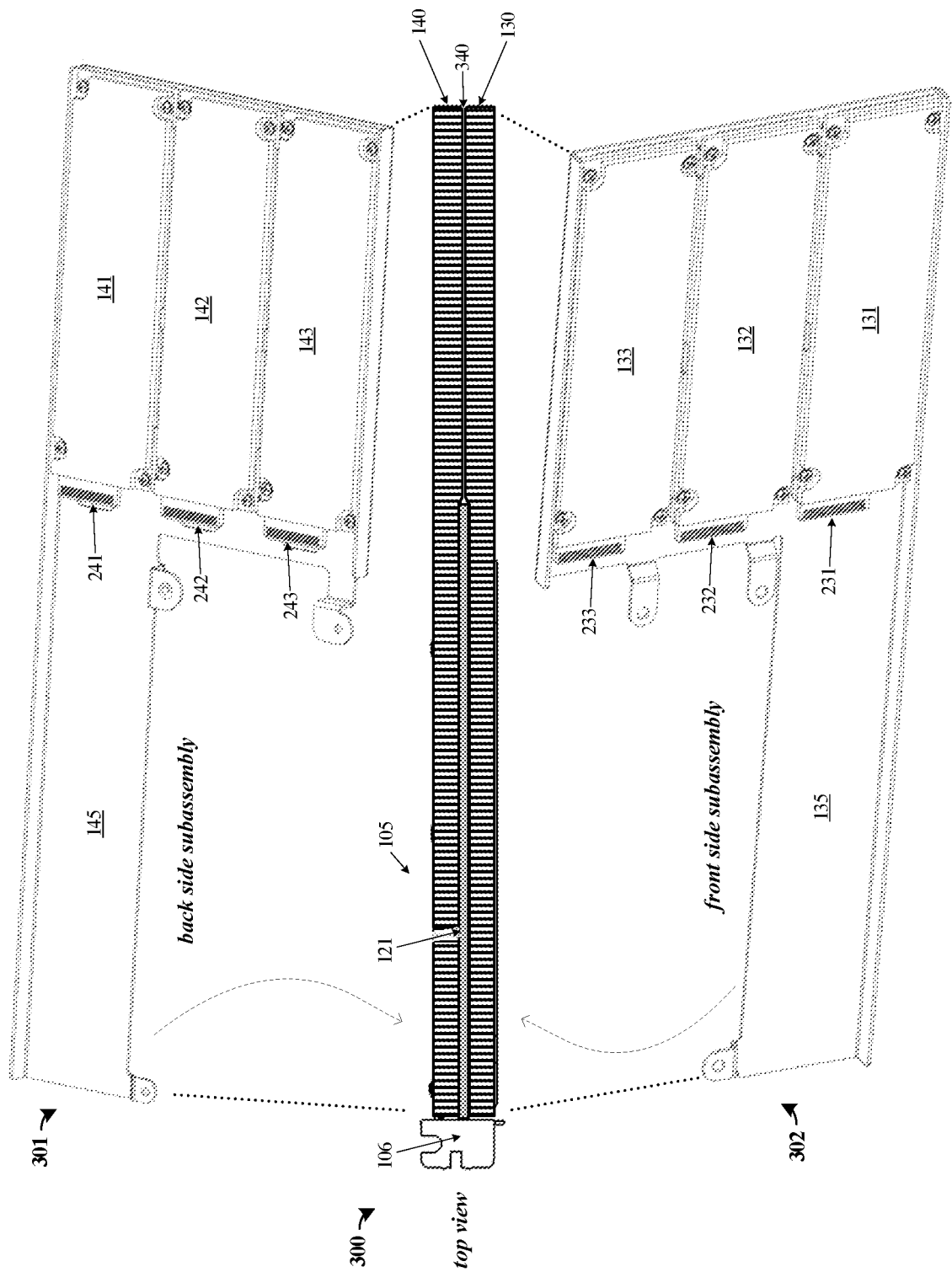
FIG. 3 illustrates an example configuration of a data storage card with attached subassemblies in an implementation.

FIG. 3 illustrates an example configuration of a data storage card with attached subassemblies in an implementation. In view 300, a top view of expansion card 105 is shown having attached storage subassemblies 130 and 140 and slot cover 106. storage Subassemblies 130 and 140 are attached via various support features noted above, as well as edge connectors and associated sockets of the storage devices. Circuit board 121 is visible in the top view of view 300. View 301 shows a back side subassembly view of storage subassembly 140, and view 302 shows a front side subassembly view of storage subassembly 130. Storage subassembly 130 has attached storage devices 131-133 and storage subassembly 140 has attached storage devices 141-143. The storage drives can attach using various techniques, such as via screws located on several or all corners of each storage device. Thermal paste or pads might be located between integrated circuits (such as memory integrated circuits) of the storage drives and structural chassis members 135 and 145.

Circuit board 121 is seen in the top/overhead view of expansion card 105. However, circuit board 121 does not run the full length of expansion card 105, and gap 340 extends between subassemblies 130 and 140 for a portion of the length of expansion card 105 lacking circuit board 121 (or 111). This gap can be advantageously employed for increased airflow and cooling between subassemblies 130 and 140 and associated storage drives.

Figure 4:
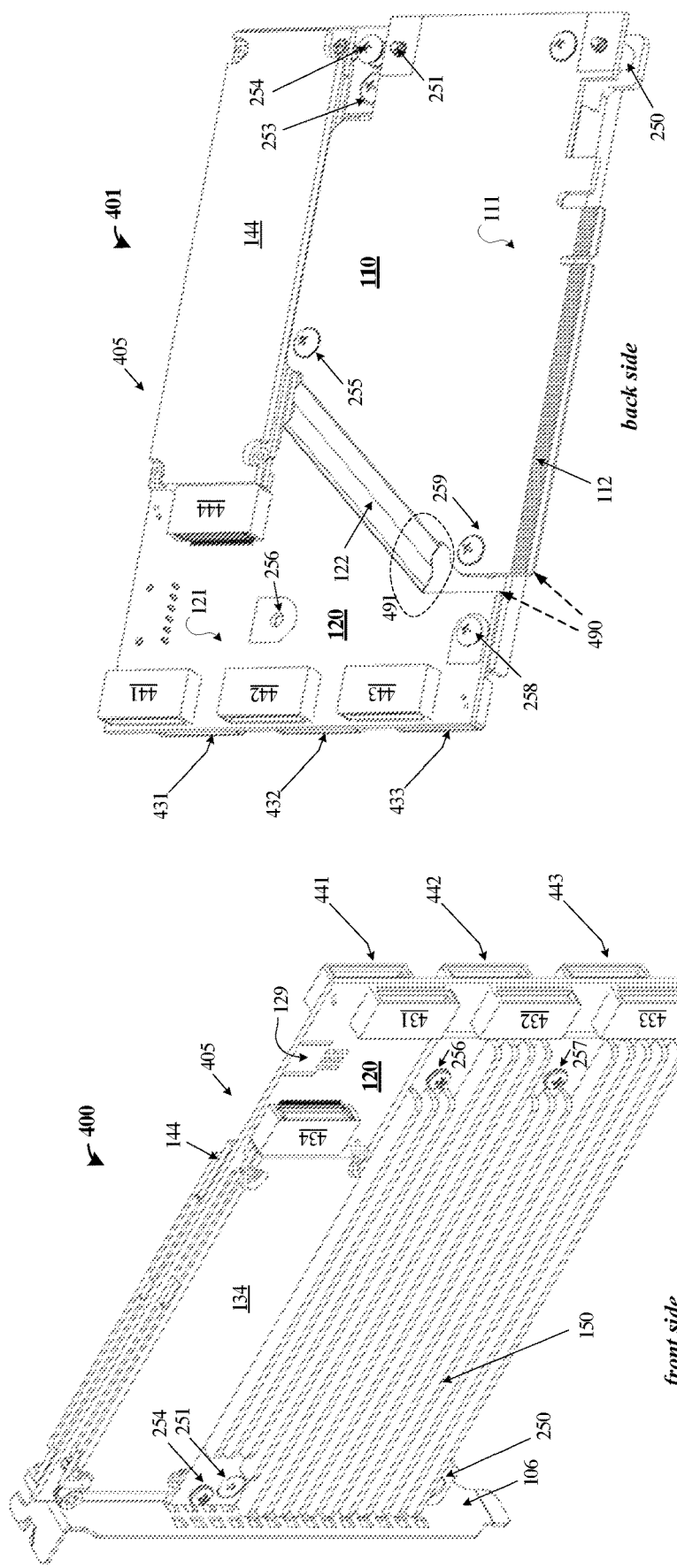
FIG. 4 illustrates an example configuration of a data storage card without subassemblies in an implementation.

FIG. 4 illustrates an example configuration of a data storage card without attached storage subassemblies in an implementation. View 400 illustrates a front view of expansion card 105 having heat sink assembly 150 and slot cover 106 attached. View 401 illustrates a back view of expansion card 105. Also attached in view 400 are two storage drive modules (134, 144) which couple to connectors 434 and 444 and to respective circuit boards 111 and 121. Connectors 431-434 and 441-444 are visible in FIG. 4, with three connectors on each side of expansion card 105 dedicated to coupling to storage drives included with storage subassemblies. Thus, the storage drives cantilever off of circuit board 121 into "free space" when coupled into connectors 431-433 and 441-443, and are supported by the structural member of the corresponding storage subassemblies.

Heat sink assembly 150 is also shown as establishing an offset or skewed offset relationship 490 between circuit boards 111 and 121. Various standoffs, risers, spacers, or similar features are included in heat sink assembly 150 to maintain this relationship 490. For example, features 250, 251, 255, 257, and 259 are shown as holding circuit board 111 at a first position, while features 253, 256, and 258 are shown as holding circuit board 121 at a second position. These two relative positions among circuit board 111 and 112 establish a stackup comprising a skewed offset relationship. Thus, circuit board 121, when coupled to heat sink assembly 150, provides for an offset from primary circuit board 111 and away from edge connector 153. The offset distance can vary, and might be established by a stackup height of connectors 431-434 and 441-444. Example offsets include 4 millimeters (mm)+/−1 mm, although other configurations are possible. This skewed offset relationship allows for edge connector 112 of circuit board 111 to be inserted into an expansion slot of a host system while providing for storage drives on both sides of circuit board 121 and still fitting expansion card 105 into an expansion slot width of the host system. Advantageously, additional clearance on the 'back' side of expansion card 105 is established to mount the storage drives via connectors, creating a modular arrangement having eight (8) or more storage modules.

Moreover, circuit interconnect element 122 is shown in view 401 as communicatively coupling circuit boards 111 and 121 over skewed offset gap 491. While a flexible circuit interconnect is employed in this example, it should be understood that various rigid interconnection elements can be included, provided these interconnect elements meet the stackup and slot width requirements. Communications across circuit interconnect element 122 include PCIe communications related to coupling the storage drives to a control processor or communication switch circuit, as well as power connections and sideband signaling. A portion of the power for storage drives can be provided over connection 129.

Figure 5:
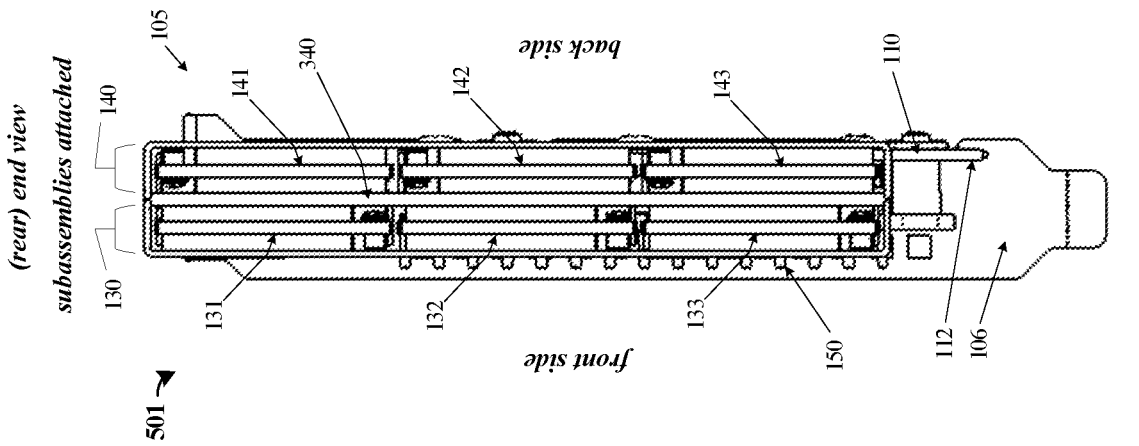
FIG. 5 illustrates example end views of a data storage card in an implementation.
Figure 5:
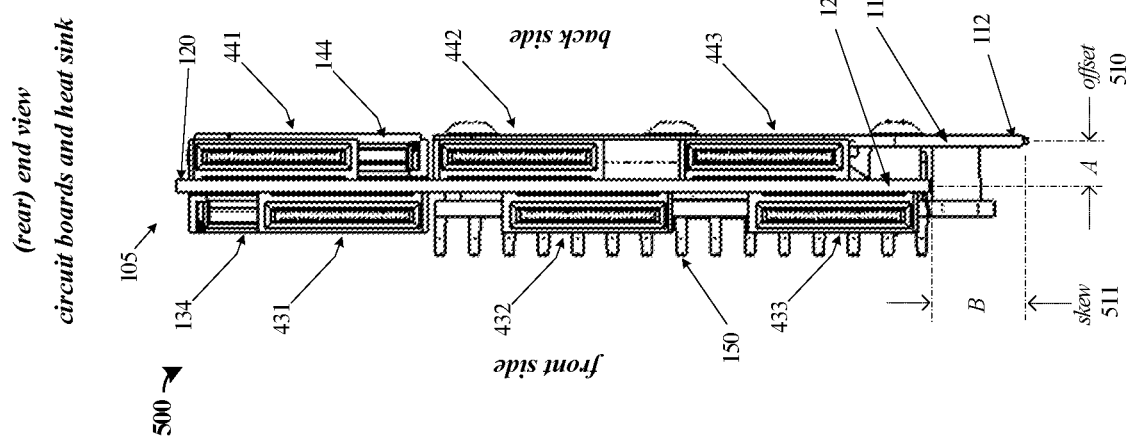

FIG. 5 illustrates example longitudinal end views of a data storage card in an implementation. View 500 illustrates a rear longitudinal end view of expansion card 105 without storage subassemblies 130 and 140 attached. View 501 illustrates a rear longitudinal end view of expansion card 105, as viewed from the storage connector end with storage subassemblies 130 and 140 attached. Furthermore, view 501 shows slot cover 106 attached. The rear longitudinal end in this example comprises a longitudinal end opposite to that of slot cover 106.

In view 500, connectors 431-434 and 441-444 are visible, with connectors 431-433 and 441-443 facing the rear longitudinal end of expansion card 105 and mounted on circuit board 121, and connectors 434 and 444 facing the front longitudinal end of expansion card 105. As mentioned herein, a skewed offset relationship or stackup is established between circuit board 111 and circuit board 121. View 500 shows stackup offset 510 (A) between circuit board 111 and circuit board 121, and vertical skew 511 (B) between circuit board 111 and circuit board 121. As mentioned herein, stackup offset 510 might comprise 4 mm, and skew 511 can depend on the implementation and positioning of connectors 431-434 and 441-444. In view 501, storage subassemblies 130 and 140 are coupled to heat sink assembly 150 and circuit board 121, and associated storage drives are coupled into connectors 431-433 and 441-443. Also, of note in view 501 is gap 340 which provides for separation between storage subassemblies 130 and 140. Gap 340 can provide for airflow or cooling access to the space between storage subassemblies 130 and 140.

Figure 6:
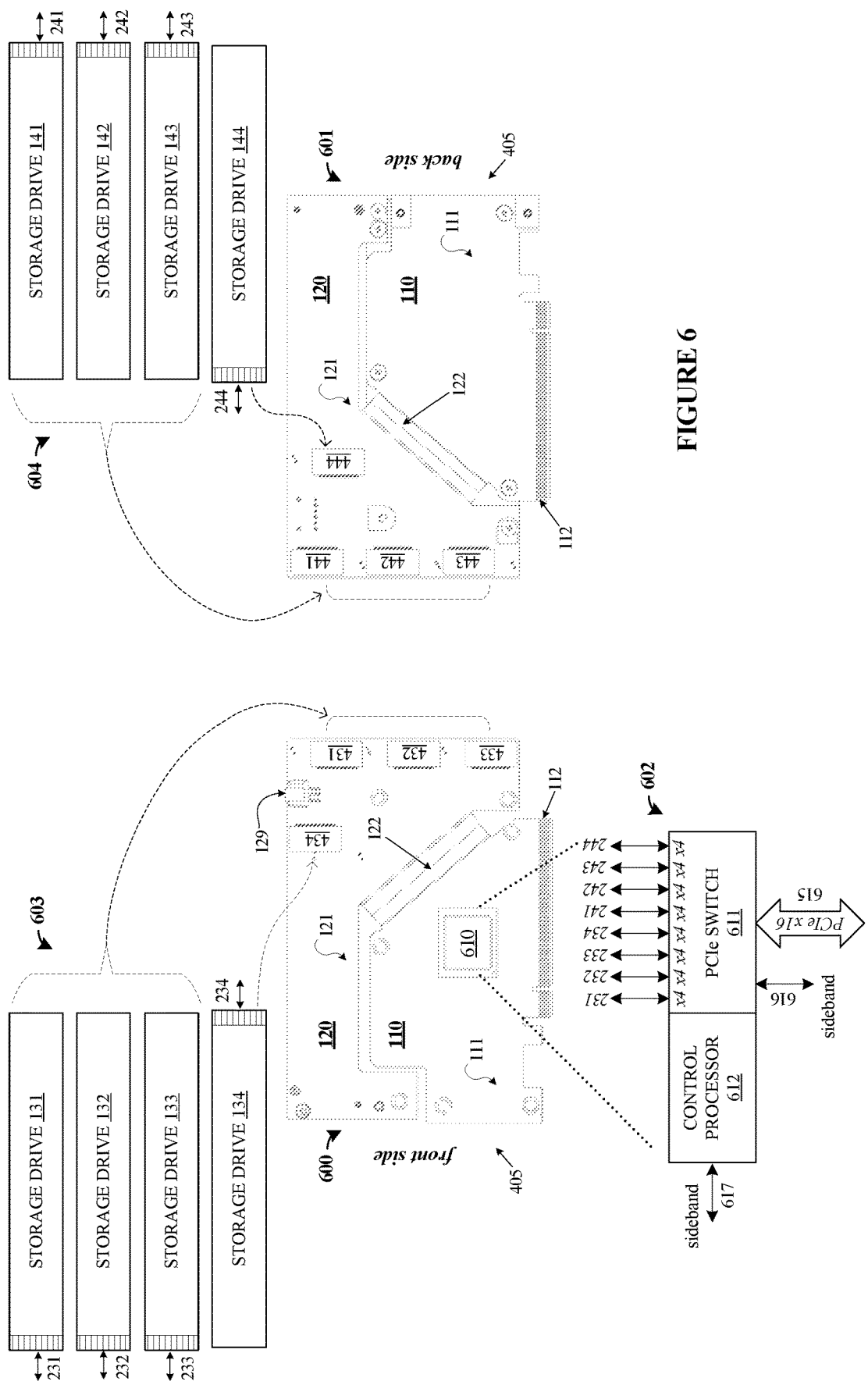
FIG. 6 is a block diagram illustrating a data storage card in an implementation.

FIG. 6 is a block or schematic diagram illustrating a data storage card in an implementation. FIG. 6 illustrates a further example configuration of expansion card 105 without attached storage subassemblies and heat sink assemblies in an implementation. In this example, heat sink assembly 150 is not attached to show underlying circuit elements. Specifically, communication switch circuit 610 is included on circuit board 111 of circuit assembly 110, as seen in front side view 600. View 600 comprises a front side view of expansion card 105, view 601 comprises a back side view of expansion card 105, view 602 illustrates a schematic representation of circuitry of expansion card 105, and views 603-604 illustrate example storage modules pluggable into storage connectors on expansion card 105.

While various communication fabrics, interfaces, links, protocols, versions, and standards might be employed, for purposes of illustration, communication switch circuit 610 comprises a PCIe switch circuit having a quantity of lanes necessary to support edge connector 112 and eight storage drives. An example lane configuration includes 48 total lanes provided by communication switch circuit 610, with 16 lanes for edge connector 112 (host connection) and 4 lanes each for storage drives 131-134 and 141-144. This relates to one "×16" host connection (edge connector 112) and eight "×4" drive connections (drive connectors 231-234 and 241-244). Communication switch circuit 610 communicates with storage drives over associated communication links, which are routed via circuit board 111, circuit interconnect element 122, and circuit board 121 to reach the corresponding storage connectors. Communication switch circuit 610 also communicates with a host system or host device over edge connector 112 when inserted into a corresponding slot connector of the host system. As mentioned herein, power and sideband signaling can also be coupled to communication switch circuit 610 and to other components on circuit boards 111 and 121.

Figure 7:
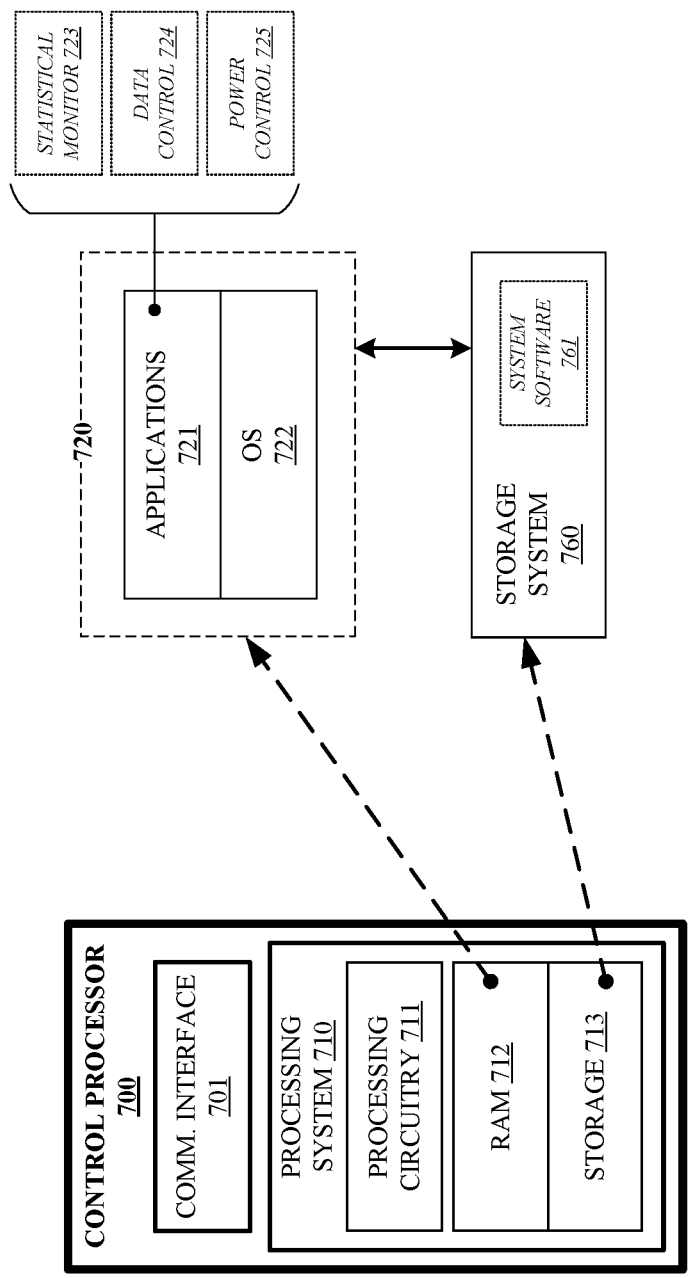
FIG. 7 is s block diagram illustrating a control processor in an implementation.

While FIG. 6 shows communication switch circuit 610 comprising a PCIe switch integrated circuit, various other control processors, circuit elements, and power control circuitry can be included. For example, a power controller or power control circuitry might distribute power to each element of expansion card 105 over associated power links. A power controller can selectively enable/disable power for each power link, monitor power consumption, and respond to control signaling from further control processors or control circuitry. A control processor can include various control elements and software to control the operation of communication switch circuit 610, such as initialization operations, storage drive detection and characterization operations, storage arraying or redundancy operations, error correction operations, encryption or decryption operations, user access control operations, maintenance operations, power control operations, sideband communications, manufacturing test operations, and other various operations. View 602 shows one example configuration of a control processor 612 with PCIe switch circuit 611. FIG. 7 shows an additional implementation of a control processor. Although control processor 612 and PCIe switch 611 are shown as separate elements in FIG. 6, it should be understood that these can be included (or be implemented) in the same circuitry, processor, integrated circuit, or software. In some instances, PCIe switch 611 includes control processor circuitry embedded therein.

When employed, control processor 612 may comprise an Intel, Apple, AMD, ARM-compatible microprocessor or microcontroller, field-programmable gate array (FPGA), application specific integrated circuit (ASIC), or application specific processor, although other circuitry can be employed. Control processor 612 can comprise one or more microprocessors, processing devices, multi-core processors, processing circuitry, or other processing system. Control processor 612 can include one or more non-transitory memory devices, such as RAM, solid state storage, or other memory to store instructions that are executable by control processor 612 to operate as discussed herein. Control processor 612 can comprise any processing elements discussed below for processor 700 of FIG. 7. Control processor 612 can monitor usage statistics, traffic status, or other usage information through various sideband status or control links. Control processor 612 can optionally communicate over at least sideband links 616 or 617. Sideband links 616 and 617 can include Universal Serial Bus (USB), SMBus, JTAG, Inter-Integrated Circuit (I2C), controller area network bus (CAN), or any other communication interface, and in some examples is provided over sub-portions of a PCIe link or dedicated PCIe links (i.e., ×1 management PCIe links).

PCIe switch 611 comprises one or more PCIe crosspoint switches, which logically interconnect various ones of the associated PCIe links based at least on the traffic carried by each PCIe link. PCIe switch 611 establishes switched connections between any PCIe interfaces handled by PCIe switch 611. Each PCIe switch port might comprise a non-transparent (NT) or transparent (T) port, as well as ports isolated by domain-based logical port segregation. An NT port can allow some logical isolation between endpoints, while a transparent port does not allow logical isolation, and has the effect of connecting endpoints in a purely switched configuration. Access over an NT port or ports can include additional handshaking between the PCIe switch and the initiating endpoint to select a particular NT port or to allow visibility through the NT port. In other examples, a domain-based PCIe signaling distribution can be included which allows logical segregation or partitioning of PCIe ports of a PCIe switch according to user-defined groups. In some examples, PCIe switch 611 comprises one or more among PLX/Broadcom/Avago PEX8796 24-port, 96 lane PCIe switch chips, PEX8725 10-port, 24 lane PCIe switch chips, PEX97xx chips, PEX9797 chips, or other PEX chips.

Although PCIe links are used in FIG. 6, it should be understood that additional or different communication links or busses can be employed, such as Gen-Z, Ethernet, InfiniBand, NVMe, Internet Protocol (IP), Serial Attached SCSI (SAS), FibreChannel, Thunderbolt, Serial Attached ATA Express (SATA Express), Cache Coherent Interconnect for Accelerators (CCIX), Compute Express Link (CXL), Open Coherent Accelerator Processor Interface (OpenCAPI), among other interconnect, network, and link interfaces. Any of the links in FIG. 6 can each use various communication media, such as air, space, metal, optical fiber, or some other signal propagation path, including combinations thereof. Any of the PCIe links in FIG. 6 can include any number of PCIe links or lane configurations. Any of the links in FIG. 6 can each be a direct link or might include various equipment, intermediate components, systems, and networks. Any of the links in FIG. 6 can each be a common link, shared link, aggregated link, or may be comprised of discrete, separate links.

PCIe switch 611 communicates with one or more on-card storage drives over associated PCIe links. PCIe switch 611 can also be communicatively coupled to an on-card processor or control system (e.g., control processor 612) for traffic statistics retrieval, power monitoring, status monitoring, among other operations. PCIe switch 611 communicates with a host system or host module (not pictured) over PCIe link 615. PCIe link 615 can comprise a PCIe link with multiple lanes, such as a "×16" PCIe link, although a different number of PCIe lanes can be employed. Additionally, more than one PCIe link 615 can be employed for load balancing, redundancy, and failover protection for expansion card 105. PCIe switch 611 also communicates with eight storage drives over associated ×4 PCIe links, although a different number of storage drives can be employed. PCIe can support multiple bus widths, such as ×1, ×4, ×8, ×16, and ×32, with each multiple of bus width comprising an additional "lane" for data transfer. The PCIe links discussed herein can be any generation of PCIe links, such as generations 3, 4, 5, 6, or Gen-Z generations, among others. Expansion card 105 also supports transfer of sideband signaling, such as System Management Bus (SMBus) interfaces and Joint Test Action Group (JTAG) interfaces, as well as associated clocks, power, and bootstrapping, among other signaling.

PCIe link 615 and PCIe links associated with drive connectors 231-234 and 241-244 can carry NVMe (NVM Express) traffic issued by a host processor or host system. NVMe (NVM Express) is an interface standard transported over PCIe (or other communication fabric types) for mass storage devices, such as hard disk drives and solid-state memory devices. However, these NVMe interfaces are often limited to one-to-one host-drive relationship, similar to legacy SATA devices. In the examples discussed herein, a PCIe interface can be employed to transport NVMe traffic and present a multi-drive system as one or more NVMe virtual logical unit numbers (VLUNs) over a combined host PCIe interface.

In further examples, control processor 612 can monitor PCIe traffic for the storage drives and manage the storage drives in a logical manner. For example, data striping can be employed by control processor 612 to stripe data for a particular write transaction over any number of storage drives, such as over all of the storage drives or a subset of the storage drives. Likewise, data redundancy can be employed to mirror data over any of storage drives. In further examples, ones of storage drives are presented as one or more logical drives or logical volumes to a host system, such as one or more NVMe virtual logical units (VLUNs). Control processor 612 can manage striping, mirroring, or logical volume establishment and presentation. In a first example, PCIe switch 611 handles routing of all PCIe traffic for storage drives over PCIe interface 615 and distributes to appropriate storage drives to achieve striping, mirroring, or logical volumes—as directed by control processor 612. In other words, control processor 612 monitors traffic in PCIe switch 611 and instructs PCIe switch 611 to direct PCIe traffic to appropriate storage drives to achieve striping, mirroring, or logical volumes. As mentioned above, control processor 612 can present the storage resources of expansion card 105 as a VLUN, such as NVMe VLUNs. Control processor 612 can present any number of VLUNs to an external system over PCIe link 615. These VLUNs can be presented as an NVMe target. An NVMe target can present the storage resources of expansion card 105 as a single storage target, such as emulating a single storage drive, over a PCIe interface. In this manner, a plurality of storage drives that comprise any number of storage drives can be presented as a single NVMe target to an external system over a PCIe interface. Control processor 612 can receive NVMe storage traffic, such as NVMe frames, and distribute these storage transactions for handling by an assigned storage drive. In other examples, control processor 612 monitors NVMe storage traffic in PCIe switch 611 and instructs PCIe switch 611 to direct PCIe traffic to appropriate storage drives to achieve VLUNs or NVMe targets.

Each storage drive 131-134 and 141-144 comprises a solid-state drive (SSD) in this example, and communicates with external systems over an associated PCIe interface 231-234 and 241-244 included in each storage drive. Each storage drive comprises an individual SSD module or card, which communicates over an associated PCIe interface, although variations are possible. The solid-state storage media of storage drives 131-134 and 141-144 can comprise flash memory, static RAM, NAND flash memory, NOR flash memory, memristors, magnetic random-access memory (MRAM), or other solid-state media. Instead of or in addition to solid state media, each storage drive 131-134 and 141-144 can comprise magnetic storage, such as hard disk drives, tape drives, magnetoresistive memory devices, and the like, or can comprise optical storage, such as phase change memory. Instead of mass data storage media, other media, such as random-access memory (RAM), static RAM, or dynamic RAM can be employed. In further examples, hybrid devices, such as cross-point storage devices, Intel Optane™, or other devices can be included.

Each storage drive 131-134 and 141-144 can receive read transactions and write transactions issued by a host system, such as a host processor. Responsive to a read transaction, each storage drive can retrieve data identified by the read transaction and transfer the data for delivery to the associated host. Responsive to a write transaction, each storage drive can write data that accompanies the write transaction to storage media associated with storage drive. Data striping, mirroring, or other data redundancy schemes can be employed by expansion card 105 to place data for a particular write transaction over any number of storage drives. Expansion card 105 might be configured to provide self-power during power interruption events. In such cases, expansion card 105 will use on-board holdup power to commit in-flight write data associated with pending write operations before power down of circuitry of expansion card 105. The in-flight write data can be committed to associated storage drives, or it can be committed to other non-volatile memory such as a non-volatile write cache which can hold write data until power is restored. Once any in-flight write data has been committed to non-volatile memory, then excess or remaining holdup power can be held for future use, bled off into dummy loads, or redistributed to other cards over PCIe power links or other power links.

Each storage drive 131-134 and 141-144 can comprise E1.S compatible connectors defined by the Enterprise & Datacenter Storage Form Factor (EDSFF) standards that may use the SFF-TA-1002 ×4 or ×8 connectors, among others, including E1.L, E3.S, and E3.L compatible connectors. Other examples may use other storage drive connector types, such as M.2 connector types. Each storage drive 131-134 and 141-144 comprises a circuit board and assembly which is separate from circuit boards 111 or 121, and each includes a connector that interfaces with a connector on circuit board 121. In other examples, each storage drive comprises one or more flash memory chips with a PCIe interface which is soldered onto the corresponding circuit board. In yet other examples, each storage drive comprises one or more separate solid-state disk drives or magnetic hard disk drives along with associated enclosures and circuitry.

FIG. 7 is a block diagram illustrating control processor 700. Control processor 700 illustrates an example of any of the communication switch and associated control modules or control processors discussed herein, such as communication switch circuit 610, control processor 612 or PCIe switch 611 of FIG. 6. Control processor 700 includes communication interface 701 and processing system 710. Processing system 710 includes processing circuitry 711, random access memory (RAM) 712, and storage 713, although further elements can be included. Example contents of RAM 712 are further detailed in RAM space 720, and example contents of storage 713 are further detailed in storage system 760.

Processing circuitry 711 can be implemented within a single processing device but can also be distributed across multiple processing devices or sub-systems that cooperate in executing program instructions. Examples of processing circuitry 711 include general purpose central processing units, microprocessors, application specific processors, and logic devices, as well as any other type of processing device.

In some examples, processing circuitry 711 includes physically distributed processing devices, such as cloud computing systems.

Communication interface 701 includes one or more communication and network interfaces for communicating over communication links, networks, such as packet networks, the Internet, and the like. The communication interfaces can include PCIe interfaces, serial links, such as SPI links, I2C links, USB links, UART links, or one or more local or wide area network communication interfaces which can communicate over Ethernet or Internet protocol (IP) links. Communication interface 701 can include network interfaces configured to communicate using one or more network addresses, which can be associated with different network links. Examples of communication interface 701 include network interface card equipment, transceivers, modems, and other communication circuitry.

RAM 712 and storage 713 together can comprise a non-transitory data storage system, although variations are possible. RAM 712 and storage 713 can each comprise any storage media readable by processing circuitry 711 and capable of storing software. RAM 712 can include volatile and nonvolatile, removable and non-removable media implemented in any method or technology for storage of information, such as computer readable instructions, data structures, program modules, or other data. Storage 713 can include non-volatile storage media, such as solid-state storage media, flash memory, phase change memory, or magnetic memory, including combinations thereof. RAM 712 and storage 713 can each be implemented as a single storage device but can also be implemented across multiple storage devices or sub-systems. RAM 712 and storage 713 can each comprise additional elements, such as controllers, capable of communicating with processing circuitry 711.

Software stored on or in RAM 712 or storage 713 can comprise computer program instructions, firmware, or some other form of machine-readable processing instructions having processes that when executed a processing system direct control processor 700 to operate as described herein. For example, software can drive processor 700 to control data flow and logical partitional of a PCIe fabric, monitor operating statistics and status for various storage drives and other modules, monitor power status for the storage drives and modules, and instruct power circuitry to control flow power, control power down or reset of various on-board storage drives, control performance throttling, among other operations. The software can also include user software applications, application programming interfaces (APIs), or user interfaces. The software can be implemented as a single application or as multiple applications. In general, the software can, when loaded into a processing system and executed, transform the processing system from a general-purpose device into a special-purpose device customized as described herein.

RAM space 720 illustrates a detailed view of an example configuration of RAM 712. It should be understood that different configurations are possible. RAM space 720 includes applications 721 and operating system (OS) 722. Software applications 723-725 each comprise executable instructions which can be executed by processor 700 for operating a power controller or other circuitry according to the operations discussed herein.

Specifically, statistical monitor 723 monitors usage status or usage statistics for elements of cards and modules. The usage statistics include data transfer rates of links, error rates of links, a cumulate number of errors of links, among other statistics. The usage statistics can be collected and stored by processor 700 in a data structure, such as a database or table and stored in storage 713, RAM 712, or other storage elements.

Data control 724 can control operations of an expansion card and of PCIe switch circuitry to establish logical units, establish virtual logical unit numbers, establish and control data redundancy or striping schemes, establish logical partitioning within a PCIe fabric or PCIe switch circuit to group one or more storage drives into a logical unit, perform bootstrapping operations for expansion cards, detect presence, operational status, and state of storage drives, and communicate with hosts to provide configuration data or other system data, among other operations.

Power control 725 monitors power statistics during a power up, operational, or power-down processes, power status statistics, power active status, voltage levels, phase measurements, current draw, holdup circuit status or levels, card/module insertion status, thermal levels, among other statistics. Power control 725 instructs power circuitry to power up or power down an associated drive, card, circuitry, or module responsive to statistical monitor 723 or data control 724, among other signals such as discrete signals monitored by associated power circuitry. Power control 725 can power up or power down a card or module responsive to data commit status of associated storage drives or other circuitry, responsive to insertion status, or other factors.

Applications 721 and OS 722 can reside in RAM space 720 during execution and operation of control processor 700, and can reside in storage system 760 during a powered-off state, among other locations and states. Applications 721 and OS 722 can be loaded into RAM space 720 during a startup or boot procedure as described for computer operating systems and applications.

Storage system 760 illustrates a detailed view of an example configuration of storage 713. Storage system 760 can comprise flash memory such as NAND flash or NOR flash memory, MRAM, phase change memory, magnetic memory, among other solid state storage technologies. As shown in FIG. 7, storage system 760 includes system software 761. As described above, system software 761 can be in a non-volatile storage space for applications and OS during a powered-down state of control processor 700, among other operating software.

Control processor 700 is generally intended to represent a computing system with which at least software 761 and 721-725 are deployed and executed in order to render or otherwise implement the operations described herein. However, control processor 700 can also represent any computing system on which at least software 761 and 721-725 can be staged and from where software 761 and 721-725 can be distributed, transported, downloaded, or otherwise provided to yet another computing system for deployment and execution, or yet additional distribution.

The functional block diagrams, operational scenarios and sequences, and other various illustrations provided in the Figures are representative of exemplary systems, environments, and methodologies for performing novel aspects of the disclosure. While, for purposes of simplicity of explanation, methods included herein may be in the form of a functional diagram, operational scenario or sequence, or flow diagram, and may be described as a series of acts, it is to be understood and appreciated that the methods are not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all acts illustrated in a methodology may be required for a novel implementation.

The various materials and manufacturing processes discussed herein are employed according to the descriptions above. However, it should be understood that the disclosures and enhancements herein are not limited to these materials and manufacturing processes, and can be applicable across a range of suitable materials and manufacturing processes. Thus, the descriptions and figures included herein depict specific implementations to teach those skilled in the art how to make and use the best options. For the purpose of teaching inventive principles, some conventional aspects have been simplified or omitted. Those skilled in the art will appreciate variations from these implementations that fall within the scope of this disclosure. Those skilled in the art will also appreciate that the features described above can be combined in various ways to form multiple implementations.

What is claimed is:

1. A computer peripheral device, comprising:
   a heat sink member that establishes a skewed offset stackup between a primary circuit board and a secondary circuit board coupled thereto;
   a circuit interconnect element configured to communicatively couple across the skewed offset stackup between the primary circuit board and the secondary circuit board;
   the primary circuit board comprising an edge connector insertable into a slot connector of a host system and configured to carry host signaling for the computer peripheral device;
   the secondary circuit board comprising a first set of data storage device connectors on a first side and a second set of data storage connectors on a second side;
   subassembly connection features established on at least one among the heat sink member, the primary circuit board, and the secondary circuit board, and configured to couple to storage subassemblies that carry data storage devices;
   a first storage subassembly coupled to a first portion of the subassembly connection features and configured to carry first data storage devices cantilevered from and connected into the first set of the data storage device connectors; and
   a second storage subassembly coupled to a second portion of the subassembly connection features and configured to carry second data storage devices cantilevered from and connected into the second set of the data storage device connectors.

2. The computer peripheral device of claim 1, wherein the skewed offset stackup accommodates, within a chassis slot width associated with the slot connector, corresponding data storage devices installed onto the first set of the data storage device connectors on the first side and the second set of the data storage connectors on the second side; and
   wherein when the first circuit board is inserted into the slot connector via the edge connector, the secondary circuit card is not aligned with the slot connector.

3. The computer peripheral device of claim 1, comprising:
   the secondary circuit board comprising a first additional data storage device connector on the first side and a second additional data storage connector on the second side; and
   wherein additional storage devices mount to the secondary circuit board when coupled to the first additional data storage device connector and second additional data storage connector.

4. The computer peripheral device of claim 1, comprising:
   the heat sink member forming a structural support coupled to at least the primary circuit board, the secondary circuit board, the first storage subassembly, and the second storage subassembly.

5. The computer peripheral device of claim 1, comprising:
   the circuit interconnect element comprising a flexible circuit interconnect having connections to the primary circuit board and the secondary circuit board and flexibly spanning across the skewed offset stackup.

6. The computer peripheral device of claim 1, wherein the computer peripheral device comprises a Peripheral Component Interconnect Express (PCIe) expansion card, and wherein the host signaling comprises PCIe signaling.

7. The computer peripheral device of claim 1, comprising:
   a Peripheral Component Interconnect Express (PCIe) switch circuit disposed on the primary circuit board that interworks PCIe signaling among the edge connector and corresponding data storage device connectors; and
   the heat sink member thermally coupled to the PCIe switch circuit.

8. The computer peripheral device of claim 1, wherein the first set of the data storage device connectors and the second set of the data storage connectors each comprise at least one among an EDSFF E1.S device connector and M.2 device connector.

9. A data storage card, comprising:
   an interface circuit board having an edge connector insertable into a slot connector of a host system and comprising a Peripheral Component Interconnect Express (PCIe) switch circuit configured to interwork host PCIe signaling with data storage devices carried by the data storage card;
   a carrier circuit board comprising data storage device connectors, with a first set of the data storage device connectors positioned on a first side and a second set of the data storage device connectors positioned on a second side;
   a circuit interconnect element configured to communicatively couple across a skewed offset stackup established between the interface circuit board and the carrier circuit board;
   a heat sink element that maintains the skewed offset stackup and thermally couples to the PCIe switch circuit;
   subassembly connection features established on at least one among the heat sink element, the interface circuit board, and the carrier circuit board, and configured to couple to storage subassemblies that carry the data storage devices;
   a first storage subassembly coupled to a first portion of the subassembly connection features and comprising a first structural element configured to hold first data storage devices cantilevered from and connected into the first set of the data storage device connectors;
   a second storage subassembly coupled to a second portion of the subassembly connection features and comprising a second structural element configured to hold second data storage devices cantilevered from and connected into the second set of the data storage device connectors.

10. The data storage card of claim 9, wherein the skewed offset stackup accommodates, within a chassis slot width associated with the slot connector, corresponding storage devices installed onto the first set of the data storage device connectors on the first side and the second set of the data storage connectors on the second side; and wherein when the carrier circuit board is inserted into the slot connector, the carrier circuit board is not aligned with the slot connector.

11. The data storage card of claim 9, comprising:
the carrier circuit board comprising a first additional data storage device connector on the first side and a second additional data storage connector on the second side; and
wherein additional storage devices mount to the carrier circuit board independent of the storage subassemblies when coupled to the first additional data storage device connector and second additional data storage connector.

12. The data storage card of claim 9, comprising:
the heat sink element comprising the subassembly connection features forming a structural support coupled to at least the interface circuit board, the carrier circuit board, the first storage subassembly, and the second storage subassembly.

13. The data storage card of claim 9, comprising:
the circuit interconnect element comprising a flexible circuit interconnect having connections to the interface circuit board and the carrier circuit board and flexibly spanning across the skewed offset stackup.

14. The data storage card of claim 9, wherein the data storage device connectors each comprise at least one among an EDSFF E1.S device connector and M.2 device connector.

15. An apparatus, comprising:
a circuit interconnect element configured to communicatively couple across a skewed offset stackup between a first circuit board and a second circuit board;
the first circuit board comprising an edge connector insertable into a slot connector of a host system and configured to carry host signaling for data storage devices; and
the second circuit board comprising data storage device connectors, with a first set of the data storage device connectors on a first side and a second set of the data storage device connectors on a second side;
a first storage subassembly comprising a first structural element holding first data storage devices cantilevered from and connected into the first set of the data storage device connectors;
a second storage subassembly comprising a second structural element holding second data storage devices cantilevered from and connected into the second set of data storage device connectors; and
a heat sink member that maintains the skewed offset stackup among a first circuit board and a second circuit board and couples to the first circuit board, the second circuit board, the first storage subassembly, and the second storage subassembly.

16. The apparatus of claim 15, wherein when the first storage subassembly and the second storage subassembly are mounted to at least the heat sink member, an airflow gap is established between portions of the first storage subassembly and the second storage subassembly cantilevered out from corresponding data storage device connectors.

* * * * *